United States Patent [19]
Parker et al.

[11] Patent Number: 5,742,045
[45] Date of Patent: Apr. 21, 1998

[54] APPARATUS USING DIODE LASER LOGIC TO FORM A CONFIGURABLE OPTICAL GATE SYSTEM

[75] Inventors: Michael A. Parker, Liverpool; Paul D. Swanson, Ithaca, both of N.Y.; Stuart I. Libby, Albuquerque, N. Mex.; James S. Kimmet, Rome, N.Y.

[73] Assignee: The United States of America as represented by the Secretary of the Air Force, Washington, D.C.

[21] Appl. No.: 617,001

[22] Filed: Mar. 14, 1996

Related U.S. Application Data

[63] Continuation of Ser. No. 331,070, Oct. 26, 1994, abandoned.
[51] Int. Cl.⁶ ........................................................ H01J 40/14
[52] U.S. Cl. ........................ 250/214 A; 250/214 DC; 250/551
[58] Field of Search ........................... 250/551, 216, 250/214 DC, 214 A; 364/570, 947.1, 947.2, 947.7

[56] References Cited

U.S. PATENT DOCUMENTS

| | | |
|---|---|---|
| 3,553,460 | 1/1971 | Preston . |
| 4,298,839 | 11/1981 | Johnston . |
| 4,943,970 | 7/1990 | Bradley ........................................ 372/45 |
| 4,967,068 | 10/1990 | Lentine ................................... 250/214 A |
| 5,132,981 | 7/1992 | Uomi et al. ............................... 372/45 |
| 5,146,078 | 9/1992 | Luryl ...................................... 250/214 A |
| 5,229,878 | 7/1993 | Tomita et al. ........................... 359/248 |
| 5,272,356 | 12/1993 | Wen et al. ................................ 257/21 |
| 5,274,246 | 12/1993 | Hopkins et al. ........................... 257/17 |
| 5,307,366 | 4/1994 | Auffret et al. ............................. 372/96 |
| 5,329,137 | 7/1994 | Taylor et al. .............................. 257/21 |

*Primary Examiner*—Stephone B. Allen
*Attorney, Agent, or Firm*—Harold L. Burstyn; William G. Auton

[57] ABSTRACT

Configurable Optical Gates (COGs) are used to transmit and receive optical signals similar to an interconnect device as well as perform a logic function on those signals (they are smart pixels). COGs consist of a laser with an intracavity modulator, an integrated current source and one or more integrated photodetectors to drive the modulators. The devices are monolithically integrated on MultiQuantum Well (MQW) heterostructure. Certain logic functions require that the bottom N- contact which is under individual devices be accessible and electrically isolated from neighboring devices. For this reason, the laser heterostructure is grown on a semi-insulating substrate. Each COG has a built-in light baffle that prevents the laser emission from coupling into the photodetectors. The optical detection of the COG can be disabled during fabrication and the device can be directly modulated by conventional electronics.

26 Claims, 3 Drawing Sheets

APPARATUS USING DIODE LASER LOGIC TO FORM A CONFIGURABLE OPTICAL GATE SYSTEM

This application is a continuation of application Ser. No. 08/331,070, filed Oct. 26, 1994, now abandoned.

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to optical interconnect devices, and more specifically the invention pertains to a configurable optical gate used for the transmission and reception of optical signals.

It is generally believed that the computers of the future will progress from opto-electronic hybrids to all optical ones. At present, there is great interest in optical interconnections between (1) monolithically integrated electronic logic gates, (2) integrated circuits on the same board, (3) boards within the same computer, and (4) computers which form a net. These interconnections generally have a light emitter, light receiver and a signal distribution system such as (1) an optical waveguide for monolithically integrated devices, (2) lenses, gratings or holograms for wafer to wafer or board-to-board environments, or (3) optical fibers for communication between computer systems. The opto-electronic hybrids are viewed as signal processing systems with conventional logic gates and electronics that are monolithically integrated with the optical transmitters and receivers; the signal distribution system may or may not be monolithically integrated. In any case, the optical interconnect is separate from the electronics and logic.

The task of producing configurable optical gates to transmit and receive optical signals for an interconnect device as well as perform a logic function on those signals is alleviated, to some extent, by the systems disclosed in the following U.S. patents, the disclosures of which are incorporated herein by reference:

U.S. Pat. No. 5,274,246 issued to Hopkins et al;
U.S. Pat. No. 5,272,356 issued to Wen et al;
U.S. Pat. No. 5,329,137 issued to Taylor et al;
U.S. Pat. No. 5,229,878 issued to Tomita et al;
U.S. Pat. No. 5,132,981 issued to Uomi et al; and
U.S. Pat. No. 4,943,970 issued to Bradley.

The patent to Taylor et al discloses an integrated total internal reflection optical switch utilizing charge storage in a quantum well. The patent to Bradley discloses a laser fabricated from a substrate having top and bottom surfaces with a first stack of mirror layers of alternating different refractive indices formed on the substrate. The remaining patents are of similar interest.

The optical process would ideally transform two dimensional sheets of analog or digital optical data (image) by sequentially passing the image through stacked planes consisting of optical logic gates and memory elements; each plane would perform a function on the image or store it in memory. Data and programs might be stored in three dimensional crystals or holograms. Each image would consist of a large number of pixels (or bits) arranged in a checker board pattern; these pixels would be light beams that together make up the entire image. The logic gates in such a processor would perform a function on several of the pixels by combining those light beams directly in the material of the gate in such a way that a third beam is produced; this third beam would carry the result of the logic function. The logic gate would not require any conventional electronics to perform the logic function and it would also serve as the interconnection with the next plane.

The main differences between the all-optical and hybrid approaches mainly rest with (1) the relationship between the logic gates and interconnects and (2) the use of conventional electronics to perform the logic functions. Both of these issues can be addressed by the use of smart pixels. A smart pixel is a device or microminaturized cluster of devices capable of receiving, transmitting and performing logic functions on one or several light beams; this device is both logic gate and interconnect.

In view of the foregoing, it is apparent that there remains a need for a configurable optical gate system using smart pixels for the functions of AND, NAND, OR, NOR, NOT which form the basis for a complete logic family. The present invention is intended to satisfy that need.

SUMMARY OF THE INVENTION

The present invention includes a system of configurable optical gates (COGs) which are used to transmit and receive optical signals similar to an interconnect device as well as perform a logic function on those signals (they are smart pixels). COGs consist of a laser with an intracavity modulator, an integrated current source and one or more integrated photodetectors to drive the modulators. The devices are monolithically integrated on MultiQuantum Well (MQW) heterostructure. Certain logic functions require that the bottom N- contact which is under individual devices be accessible and electrically isolated from neighboring devices. For this reason, the laser heterostructure is grown on a semi-insulating substrate. Each COG has a built-in light baffle that prevents the laser emission from coupling into the photodetectors. The optical detection of the COG can be disabled during fabrication and the device can be directly modulated by conventional electronics. These devices are monolithically integrated with other optoelectronic devices and the operating wavelengths can be tailored during epitaxial growth for a variety of wavelengths including 0.85 and 1.3 um.

It is an object of the present invention to provide a system of configurable optical gates that can operate as either smart pixels or as the basic building blocks of an opto-electronic computer.

It is another object of the inventions to provide a set of configurable optical gates that exhibit gain, high on/off contrast ratios and hysteresis and, as a result, they can be cascaded.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is a design for configurable optical gates (COG's) which are used to transmit and receive optical signals similar to an interconnect device as well as perform a logic function on those signals (they are smart pixels).

Figure 1:
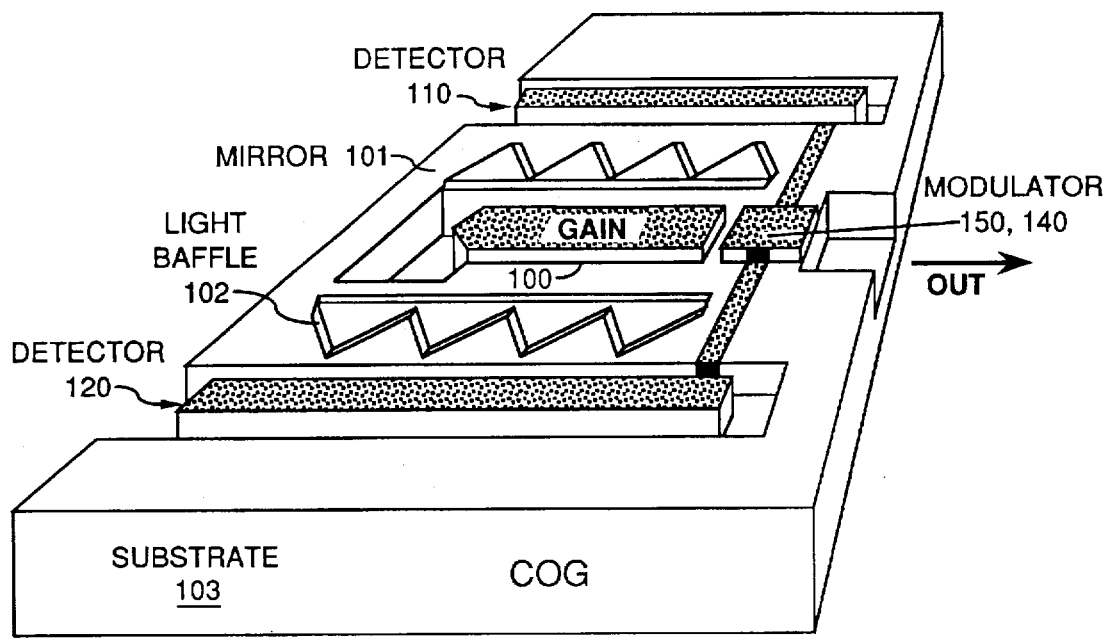
FIG. 1 is an illustration of the basic configurable optical gate of the present invention.

The reader's attention is directed towards FIG. 1 which is an illustration of a configurable optical gate containing: a laser 100 with an intracavity modulator 150, an integrated current source 140 and two integrated photodetectors to drive the modulator. The laser heterostructure is grown on a semi-insulating substrate. Each COG has a build-in light baffle that prevents the laser emission from coupling into the photodetectors. The optical detection of the COG can be disabled during fabrication and the device can be directly modulated by conventional electronics. These devices are monolithically integrated with other opto-electronic devices and the operating wavelengths can be tailored during epitaxial growth for a variety of wavelengths including 0.85 and 1.3 um.

In operation, the configurable optical gate of FIG. 1 receives and converts two optical signals through the photodetectors 110 and 120 respectively into first and second photocurrent signals which drive the modulator 150 of the laser 100.

The modulator 150 is electrically connected to a current source so that it performs logic functions on the photocurrent signals to set the state of the laser (ON or OFF) as described below.

Figure 2:
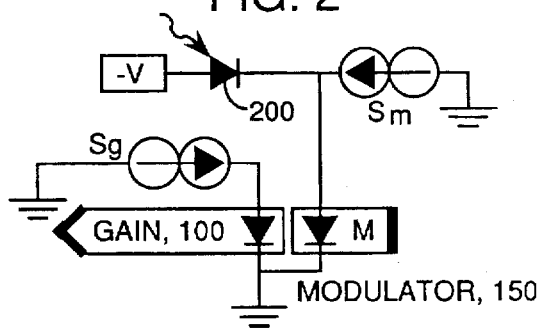
FIG. 2 is a schematic in which the current source 140 is configured to the COG an inverter.

In order to perform logic functions in response to received optical signals, the modulator 150 and current source 140 must control the laser 100 to output in either a direct response to these signals or in inverse response to these signals. FIG. 2 is a schematic of an inverter configurable optical gate design in which a bias is applied to the photodiode 200. For an optically unbiased detector, the current source $S_m$ 140 forward biases the modulator. The photodetector, with optical bias, sinks the current and reverse biases the modulator. The laser 100 is ON and OFF respectively.

In all versions of the COG, the laser consists of gain and modulator sections that are located between an etched Total Internal Reflection (TIR) mirror on one end an etched flat mirror on the other. The TIR mirror improves the efficiency of the laser by providing up to 100% reflectivity. In some devices, the TIR mirror is replaced by another flat mirror for a second output. The modulator and gain sections are separated by a shallowly etched region with an oxygen implant; this region provides electrical isolation between the two sections without significantly altering the index of refraction. A large index difference would prevent the device from operating properly by introducing a partially reflecting surface there and possibly setting up sub-cavities.

Reverse bias on the modulator inhibits laser action by increasing the optical absorption within the quantum wells. Increasing the reverse bias on the modulator results in an increasing threshold current for the laser. The laser bias current, however, is fixed between the threshold currents set by a forward and reverse biased modulator. Thus, the bias voltage on the modulator determines the lasing state of the cavity.

An optical inverter is shown in FIG. 2. The cathode of the photodetector is electrically connected to the modulator. Under normal operating conditions, the anode of the photodetector and the n-layer are all grounded while the p-contact on the laser is positively biased. Without illumination on the photodetector, the modulator current source $S_m$ forward biases the modulator and lowers the threshold current of the cavity; this causes the cavity to lase. The modulator current source is not actually needed in this circuit since emission from the gain section produces charge in the modulator that can forward bias it. When the photodetect is illuminated, it sinks both the current from the current source and the photocurrent from the modulator. The modulator becomes reverse biased and the cavity quenches.

Figure 3:
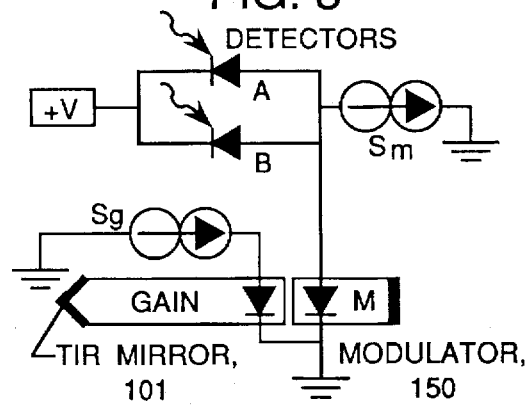
FIG. 3 is a schematic of as an optical OR gate.

The COG version of the OR gate appears in FIG. 3. When the photodetectors are not illuminated, the modulator current source reverse biases the modulator. The high threshold current prevents lasing. Illuminating either detector produces sufficient photocurrent to satisfy the current source and forward bias the modulator to allow the cavity to lase.

Figure 4:
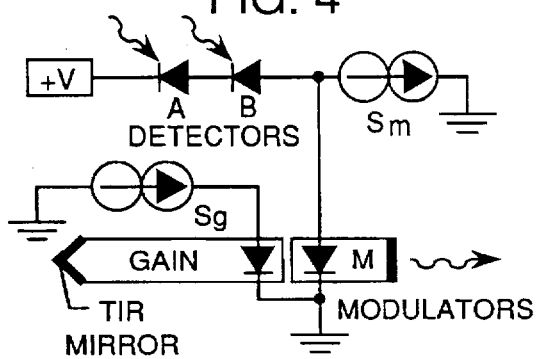
FIG. 4 is a schematic of an optical AND gate.

Two distinct versions of the AND gate are possible. The series detector configuration appears in FIG. 4. The current source $S_m$ reverse biases the modulator as before. A single illuminated photodetector forward biases itself and produces negligible photocurrent. Both detectors must be illuminated to satisfy the modulator current source and forward bias the modulator. The other AND gate configuration uses a dual modulator design that operates similarly to the OR gate previously discussed. One modulator is located at each end of the cavity. This second version has the disadvantage that the two modulators introduce higher cavity loss than the single modulator; thus, the lasing threshold currents are necessarily higher. However, when both ends of the cavity are to serve as outputs, the double modulator design has an advantage. The modulators absorb significant amounts of spontaneous emission when reverse biased. Thus, photodetectors coupled to each end of the cavity have higher on/off contrast ratios.

Figure 5:
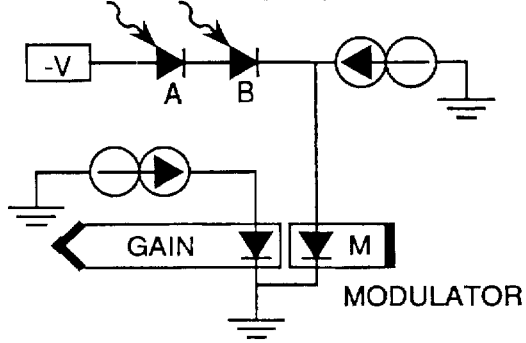
FIG. 5 is a schematic of a NAND gate.

Only one version of the NAND gate (FIG. 5) is possible with the fabrication techniques presently used. Any other design requires the cathode of the modulator to be electrically isolated from the cathode of the gain section. At present, deep etches through the active region are used to electrically isolate sections of the N-layer. Such an etch around the modulator introduces a mirror between the gain and modulator sections and, thereby, degrades the performance of the device.

Figure 6:
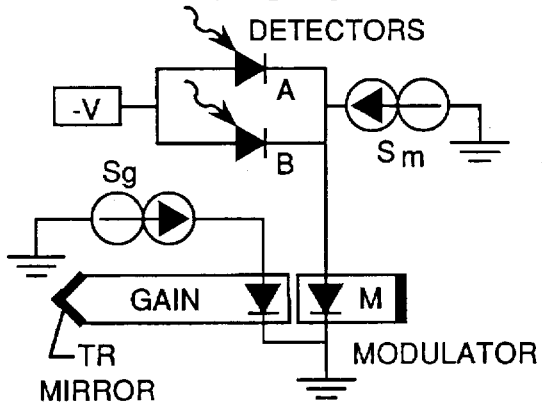
FIG. 6 is a schematic of an optical NOR gate.

An optical NOR gate is shown in FIG. 6. It operates similarly to the inverter except for the two photodetectors in parallel.

Figure 9:
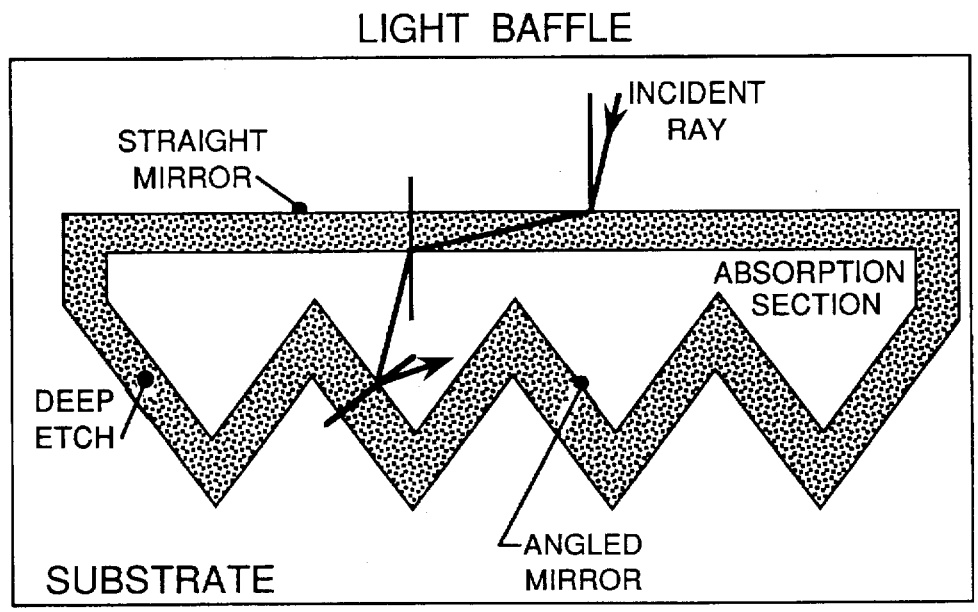
FIG. 9 is an illustration of the light baffle of FIG. 1.

A note is in order concerning the possible optical coupling between the laser and photodetectors. If necessary, a light baffle can be included with the device. The light baffle helps to optically isolate the detectors from the laser (refer to the close-up shown in FIG. 9). The light baffle consists of two deep etch regions, two mirror surfaces and an absorption region with a metal electrode. The flat mirror totally reflects light with wave-vectors making more than a 17° angle with respect to the normal; thus most of the stray light is reflected back. The light falling within the 17° angle is refracted and enters the absorption region; the wave vector within this absorption region again falls within 17° of the normal to the flat surface. The absorption region reduces the intensity of light passing through it. The absorption is enhanced by applying reverse bias to the metal electrode on the top of the absorption section. The angled reflecting surfaces totally reflect the remaining light because the angle between the wave vector of this light and the normal to any of the reflectors is always larger than 17°.

Elements of the DLL (digital logic layer) family can be combined to build larger circuits. With standard Boolean logic, on the order of 10 gates are required for a 2×2 CROSS BAR or an ADDER. Unique features of the COGs can be used to greatly simplify the designs. Any function that can be realized through Boolean logic can be implemented with the DLL family.

Figure 7:
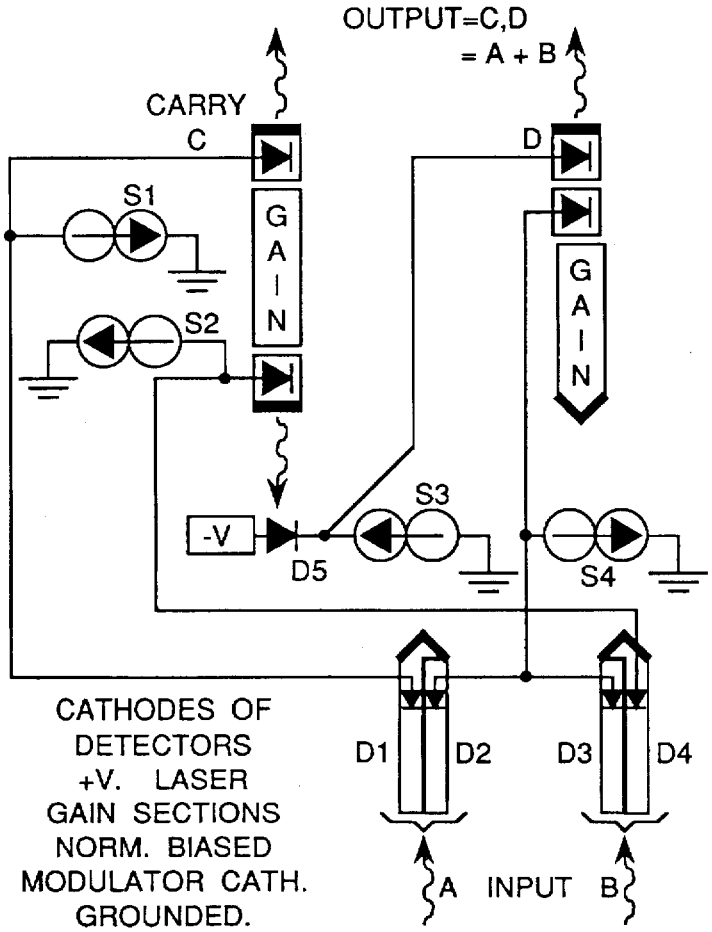
FIG. 7 is an integrated optical adder.

The integrated optical ADDER appears in FIG. 7. The ADDER has two optical inputs and each has two photodetectors electrically isolated from one another on the P side. There are two output lasers. The one on the left (right) represents the carry (sum) bit. To illustrate how it operates, consider the following cases. CASE 1: Optical bias is not present on either set of detectors. In this case, the two modulators on the carry laser are reverse-biased. As a result, detector D5 is not illuminated and source S3 forward biases the top modulator on the sum laser. However the lower modulator is reverse-biased so that the sum laser is off. CASE 2: Optical bias is applied to exactly one detector. The carry laser is quenched since only one modulator is forward-biased. Thus S3 forward biases the top modulator in the sum cavity. Light strikes either D2 or D3 so the lower modulator in the sum cavity is forward-biased. The carry laser is off and the sum laser is on. CASE 3: Optical bias is applied to both sets of detectors. Light incident on both sets of detectors causes both modulators on the carry laser to be forward-biased and the cavity lases. As a result, D5 reverse biases the top modulator on the sum cavity and the cavity does not lase.

It is possible to provide a simple model for the operation of the COGs. The Q-switched laser consists of the gain and modulator sections. Due to a two-dimensional Franz-Keldysh effect, the optical absorption in the modulator Increases with larger reverse-bias. The resulting photocarriers either recombine in the wells or tunnel through the barriers to be swept out. The radiative recombination rate decreases with field in the well since the overlap of the electron and hole wavefunctions decreases. The tunneling rate increases exponentially with electric field because, at high fields, the barrier is triangular. Thus, the electric field in the modulator determines the ratio of current recombination to sweep-out current. For intercavity modulators with a P-I-N structure, the application of bias voltage alters the existing built-in field and, thus, also, the ratio of currents. For a cavity to lase, its gain must balance out its losses. The loss in the cavity of the COG can be controlled with the voltage applied to the modulator because of the sweep-out process.

Figure 8:
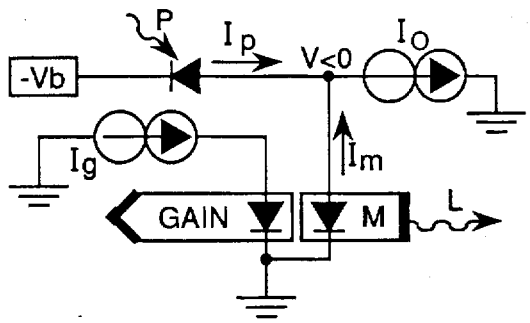
FIG. 8 is the basic circuit model of the COG.

A simple model explains the operation of the COG shown in FIG. 8. For a Q-switched laser near threshold, assume that the optical power through the modulator L is approximately related to the gain-section bias current $I_g$ and the threshold current $I_{th}$ by $$L = L_o[\exp(I_g/I_{th}) - 1] \quad (1)$$

where $L_o$ is a constant. Here, $I_g$ is fixed and $I_{th}$ is considered to be the variable since the switching is controlled by the modulator bias.

Referring to FIG. 8, the photodetector and modulator are considered to be optically controlled current sources with some bias voltage dependence characterized by resistances $R_p$ and $R_m$ respectively. (Measured resistances might have some voltage dependence.) The currents $I_m$ and $I_p$ are both combinations of photocurrents and the reverse bias leakage current. It follows that:

$$I_m = k_m L - \frac{V}{R_m} \quad (2)$$

$$I_p = k_p P - \frac{[V - V_b]}{R_p}$$

where P is the optical power absorbed by the photodetector, $k_m$ and $k_p$ are constants. For large values of current from the $I_o$ source, the reverse bias voltage must be limited by additional circuitry to prevent break-down of the modulator and detector diodes.

Figure 10:
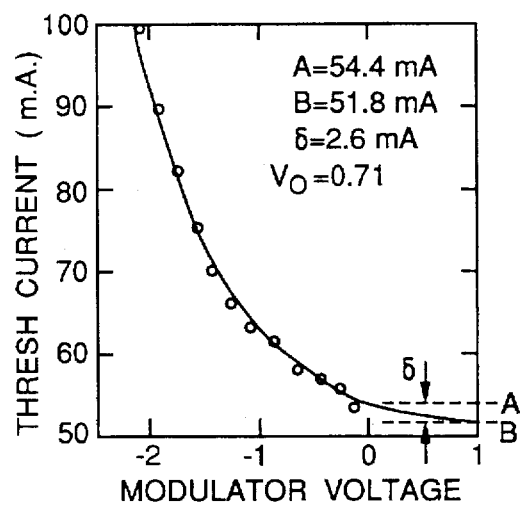
FIG. 10 is a chart of threshold current vs. modulator bias voltage.

Typical data for the threshold current vs. modulator bias voltage appears in FIG. 10. The gain section is 20 μm×200 μm for the plot. The curve is best approximated by an exponential function:

$$I_{th} = \delta e^{\frac{-\nu}{\nu_o}} + b \quad (3)$$

Where $\delta$, $V_o$ and b have the approximate values of 2.65 mA, 0.714 V and 51.85 mA respectively. These values change for smaller modulators and waveguides. Smaller devices yield high gain. The previous equations can be combined with $I_o = I_m + I_p$ to yield:

$$\exp(I_g/I_{th}) - \frac{V_o}{R_{//} k_m L_o} \ln \frac{\delta}{I_{th} - b} = 1 + \frac{I_o - k_p P}{k_m L_o} \quad (4)$$

where $R_{//}$ is the parallel combination of $R_m$ and $R_p$ and where $V_b/R_p$ is negligible in comparison to $I_o$. This can be rewritten as $$\exp(I_g/I_{th}) = \beta - \alpha \ln \frac{I_{th} - b}{\delta} \quad (5)$$

where $$\beta = 1 + \frac{I_o - k_p P}{k_m L_o} \quad (6)$$

and $$\alpha = \frac{V_o}{R_{//} k_m L_o} \quad (7)$$

Equation 5 can be interpreted as follows. 1 is the independent variable and $I_{th}$ is the dependent one. The left-hand side represents the L-I characteristics. On the right-hand side, 1 represents the difference in the currents at the modulator. The logarithmic term is a result of the $I_{th}$-V characteristics for the Q-switched laser.

Figure 11:
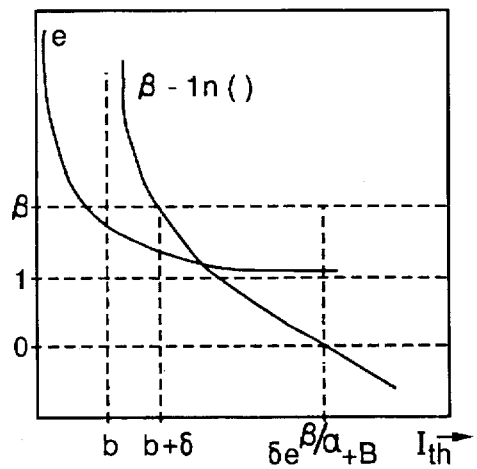
FIG. 11 is a chart of both sides of equation plotted on the same set of axes.

The left-hand and right-hand sides of equation 5 can be plotted on the same set of axes as shown in FIG. 11. The effect on $I_{th}$ of changing $I_o$ or P is evident from the graph. Suppose, for example, that the power P incident on the detector increases. In this case, 1 will decrease and the LN curve shifts down and to the left. The intersection point moves to the left to indicate that the threshold current decreases. The other cases are similar.

There are two simplifying cases. The first occurs when the cavity is lasing (1 near 1), i.e., for the approximate range of $b < I_{th} < f + \delta$:

$$I_{th} \approx b \quad (8)$$

The second case occurs for large l. Under this condition, the intersection point in FIG. 11 is far to the right where $\exp(I_g/I_{th}) \cong 1$. This condition yields $I_{th} = \delta \exp(l/\alpha) + b$. Assuming $k_p P \ll I_o$ (i.e. the large l limit) and $K_m L_o \ll I_o l/\alpha$ simplifies to $(I_c R_{//})V_o$. Thus the threshold current for large l can be written as $$I_{th} = \delta \exp(I_c R_{//}/V_o) + b \tag{9}$$

This equation is essentially the curve shown in FIG. 10 where $I_c R_{//}$ is the voltage across the modulator. The laser is off in this case.

Hysteresis in the input-output characteristics can be adjusted by changing the geometry and bias of a photodetector D coupled to the output of a gate. The photocurrent $J_d$ is added to the input signal in a positive feedback arrangement. The length, bias and coupling of detector D can be adjusted. The branches of the resulting hysteresis curve for the circuit can be explained as follows.

As the input power increases along the lower branch up to point P2, the cavity produces spontaneous emission; the detector D produces photocurrent $J_d$ that is small compared to the photocurrent $J_p = k_p P$ produced by input power P. The output power L remains small. At point P2, the photocurrent $J_d$ is still small but $J_p$ is sufficiently large to satisfy the current source. The cavity begins to lase.

$$J_p = I_c \text{ or } k_p P_2 = I_c \tag{10}$$

Thus, $$P_2 = I_c/k_p \tag{11}$$

As the incident power P increases, the amount of gain available from the modulator will saturate. The output power L saturates at $L_s$ for a given bias current to the gain section. Furthermore, L remains relatively constant along the top branch as the incident power is decreased to P1 since photocurrent $J_d$ is also helping to satisfy $I_c$. As a note, the saturation intensity increases with bias current to the gain section. At power level P1, the lasing intensity decreases since the photocurrents are no longer large enough to satisfy the modulator current source (the reverse bias voltage across the modulator is limited by additional circuitry).

$$J_p + J_d = I_c \tag{12}$$

$$k_p P 1 + k_d L_s = I_c \tag{13}$$

where $k_d$ accounts for the responsivity, coupling and the length of modulator D. Thus, $$P_1 = \frac{I_c}{k_p} - \frac{k_d}{k_p} L_s \tag{14}$$

As the incident power continues to decrease past P1, the emitted power L also decreases. The width of the hysteresis loop is approximately the difference between P2 and P1.

$$\text{Width} \cong \frac{k_d}{k_p} L_s \tag{15}$$

The width of the hysteresis loop is controlled by changing the parameter $k_d$. This parameter increases with increased optical coupling between the laser and the detector and also with increased absorption within the detector due either to increased detector lengths or increased reverse bias. However, if this parameter becomes too large, then P1 becomes negative (i.e. Width>P2) which means that the laser can not be quenched by removing the illumination P from the photodetector.

The invention uses semi-insulating substrates; however, the preliminary devices described above use N-type substrates. Similar processing is used on both types of substrates and the differences will be noted as the discussion progresses. Laser heterostructure with five quantum wells can be epitaxially grown on N-type substrates. Lasers fabricated on the heterostructure emit at 860 nm.

The wafers with the N-type substrate are processed as follows. The laser and photodetector waveguides are defined by photolithography with an image reversal process and the liftoff of a metallization layer. The metals, in the order evaporated onto the p-side of the wafer, are Ti, Pt, Au and Cr. The mirrors and waveguides are formed by etching the wafer in a Chemically Assisted Ion Beam Etcher (CAIBE) twice. The chrome in the metallization provides the etch mask and the edge of the Cr defines the mirror surface. For the first etch, a thick (3μ) layer of photoresist covers the wafer except in the regions of the deep etches. The photoresist is removed after the initial etch. The second etch, a shallow etch, forms the waveguides, the electrical isolation region between the modulator and gain sections and also continues the deep etch for the mirrors. The electrical isolation is accomplished with the ion implanting of oxygen in the shallowly etched regions. Polyimide is spun on the wafer and vias are etched through the polyimide for electrical contacting. The polyimide acts as both an insulator for the electronics and a transparent dielectric for the optics. After the polyimide is fully cured, a final metallization is used for electrical connections. The wafer is thinned and an n-type Ohmic contact, consisting of Ni, Ge, Au, Ag and Au, is evaporated on the back surface. The devices are alloyed, cleaved and mounted in preparation for testing. For semi-insulating substrates, the above procedure is followed by a wet selective etch to expose the n-type GaAs, and the same photoresist mask is used to define the n-type contact by means of liftoff. Deep etches in the semi-insulating wafers extend into the substrate for electrical isolation between neighboring devices.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. Apparatus to manipulate the optical properties of light, said apparatus comprising:
    means for generating a stimulated optical emission, said means for generating having at least one gain section and at least one monolithically integrated intra-cavity element to modulate said stimulated optical emission,
    at least one semiconductor photodetector for receiving optical energy and converting said optical energy to electrical energy;
    at least one current source to bias said at least one intra-cavity element and said at least one photodetector;
    at least one monolithically integrated optical isolator to prevent an optical emission from entering said at least one photodetector; and
    said at least one photodetector transforming an optical input into a photocurrent that flows into said at least one current source and said at least one intra-cavity element, thereby modulating an optical output from said at least one gain section.

2. Apparatus as in claim 1, wherein said at least one intra-cavity element, said at least one gain section, said at least one photodetector and said at least one current source cooperate to perform at least one logic function chosen from the group comprising: OR, AND, INVERT, NOR, NAND, and ADD.

3. Apparatus as in claim 2, wherein said at least one function is a combination of at least two members of said group.

4. Apparatus as in claim 1, wherein said at least one intra-cavity element, said at least one gain section, said at least one photodetector, and said at least one current source cooperate to perform at least one function chosen from the group comprising: storage, signal amplification, regeneration, wavelength conversion, signal routing, and multiplexing.

5. Apparatus as in claim 4, wherein said at least one function is a combination of at least two members of said group.

6. Apparatus as in claim 1 wherein said means for generating is a laser.

7. Apparatus as in claim 1 wherein said apparatus is monolithically integrated on a semiconductor.

8. Apparatus as in claim 7 wherein said semiconductor includes AlGaAs.

9. Apparatus as in claim 1 wherein said at least one current source is a resistor.

10. Apparatus as in claim 1 wherein said at least one current source is a transistor.

11. Apparatus as in claim 10 wherein said at least one current source is a field effect transistor (FET).

12. Apparatus as in claim 1 wherein said at least one photodetector is chosen from the group comprising waveguiding photodetectors, coupled waveguide detectors, p-i-n detectors, and phototransistors.

13. Apparatus as in claim 1 where said at least one monolithically integrated optical isolator has a linear mirror facet, a voltage controlled absorber section, and a triangular mirror facet, whereby the light traveling in the plane of integration is totally reflected internally.

14. A method of processing an optical signal comprising the steps of fabricating a semiconductor laser having at least one integrated intracavity modulator and at least one gain section;

monolithically integrating at least one photodetector;

monolithically integrating at least one current source;

monolithically integrating at least one optical isolator;

connecting said at least one current source to said at least one intracavity modulator and said at least one photodetector to transform an optical input signal into an optical output signal;

biasing said at least one intracavity modulator and said at least one photodetector with said at least one current source so that said laser emits an optical output signal;

applying optical energy to said at least one photodetector to produce a photocurrent and change the voltage across said at least one modulator;

fabricating an additional photodetector adjacent to said laser; and routing a photocurrent, from said additional photodetector back to a junction connecting said at least one modulator, said at least one photodetector, and said at least one current source, to adjust a width of a hysteresis loop in said optical output signal.

15. Apparatus to manipulate the optical properties of light, said apparatus comprising:

means for generating a stimulated optical emission signal, said means for generating having at least one gain section and at least one monolithically integrated intra-cavity element to modulate said emission signal into an optical output signal;

at least one semiconductor photodetector for receiving optical energy and converting said optical energy to electrical energy;

at least one current source to bias said at least one intra-cavity element and said at least one photodetector;

at least one monolithically integrated optical isolator to prevent an optical emission from entering said at least one photodetector;

said at least one photodetector transforming an optical input into a photocurrent that flows into said at least one current source and said at least one intra-cavity element, thereby modulating an optical output from said at least one gain section; and said stimulated optical emission signal and said optical output signal including encoded information.

16. Apparatus as in claim 15, wherein said circuit performs at least one function chosen from the group comprising: signal amplification, wavelength conversion, signal multiplexing, storage, binary addition, and wavelength filtering.

17. Apparatus as in claim 15, wherein said circuit performs at least one logic function.

18. Apparatus as in claim 17, wherein said logic function is chosen from the group comprising AND, OR, INVERT, NAND, and NOR.

19. Apparatus as in claim 18, wherein said logic function is a combination of at least two members of said group.

20. Apparatus as in claim 18, wherein said encoded information is a combination of at least two of: the number, the amplitude, the wavelength, and the coherence of said signals.

21. Apparatus as in claim 15, wherein said encoded information is the number of said signals.

22. Apparatus as in claim 15, wherein said encoded information is the amplitude of said signals.

23. Apparatus as in claim 15, wherein said encoded information is the wavelength of said signals.

24. Apparatus as in claim 15, wherein said encoded information is the coherence of said signals.

25. Apparatus to manipulate the optical properties of light, said apparatus comprising:

means for processing a stimulated optical emission, said means for processing having at least one gain section and at least one monolithically integrated intra-cavity element to modulate said emission signal into an optical output signal;

at least one semiconductor photodetector for receiving optical energy and converting said optical energy to electrical energy;

at least one current source to bias said at least one intra-cavity element and said at least one photodetector;

at least one monolithically integrated optical isolator to prevent an optical emission from entering said at least one photodetector; and said at least one photodetector transforming an optical input into a photocurrent that flows into said at least one current source and said at least one intra-cavity element, thereby modulating an optical output from said at least one gain section.

26. Apparatus as in claim 25 wherein said means for processing is a laser.

* * * * *